(12) United States Patent
Li

(10) Patent No.: US 10,923,672 B1
(45) Date of Patent: Feb. 16, 2021

(54) QUANTUM DOT ORGANIC LIGHT EMITTING DIODE DISPLAY PANEL

(71) Applicant: SHENZHEN CHINA STAR OPTOELECTRONICS SEMICONDUCTOR DISPLAY TECHNOLOGY CO., LTD., Shenzhen (CN)

(72) Inventor: Yuanyuan Li, Shenzhen (CN)

( * ) Notice: Subject to any disclaimer, the term of this patent is extended or adjusted under 35 U.S.C. 154(b) by 0 days.

(21) Appl. No.: 16/623,412

(22) PCT Filed: Nov. 6, 2019

(86) PCT No.: PCT/CN2019/116040
§ 371 (c)(1),
(2) Date: Dec. 17, 2019

(51) Int. Cl.
*H01L 27/32* (2006.01)
*H01L 51/50* (2006.01)
*H01L 51/52* (2006.01)

(52) U.S. Cl.
CPC .......... *H01L 51/502* (2013.01); *H01L 27/322* (2013.01); *H01L 51/5268* (2013.01)

(58) Field of Classification Search
CPC ...................................................... H01L 27/322
See application file for complete search history.

(56) References Cited

U.S. PATENT DOCUMENTS

| 2003/0127968 | A1  | 7/2003 | Kuma et al. |
| 2013/0082589 | A1* | 4/2013 | So ............... H01L 27/322 |
|              |     |        | 313/504 |
| 2015/0145405 | A1  | 5/2015 | Yang et al. |
| 2017/0179438 | A1  | 6/2017 | Xu |
| 2018/0269260 | A1* | 9/2018 | Ghosh ............ H01L 27/3244 |

FOREIGN PATENT DOCUMENTS

| CN | 1589590 A   | 3/2005 |
| CN | 103035664 A | 4/2013 |
| CN | 103227189 A | 7/2013 |
| CN | 105097878 A | 11/2015 |
| CN | 105590945 A | 5/2016 |
| CN | 110518135 A | 11/2019 |
| JP | H10255983 A | 9/1998 |

* cited by examiner

*Primary Examiner* — Daniel P Shook

(57) ABSTRACT

A quantum dot organic light emitting diode (OLED) display panel is disclosed. A red-and-blue mixture light source is used as an OLED light source corresponding to a red sub-color-resist of a color filter, and/or a green-and-blue mixture light source is used as the OLED light source corresponding to a green sub-color-resist of the color filter. A blue light source in a color-mixture light source can trigger a red/green quantum dot material of a quantum dot photo-transfer film, and the triggered light passes through the color filter. A red/green light source in the color-mixture light source can directly pass through the color filter, thereby effectively improving the brightness of the quantum dot OLED display panel and the efficiency of a display panel and prolonging the lifetime of the display panel.

19 Claims, 2 Drawing Sheets

QUANTUM DOT ORGANIC LIGHT EMITTING DIODE DISPLAY PANEL

BACKGROUND OF DISCLOSURE

1. Field of Disclosure

The present disclosure relates to the field of display technology, and more particularly, to a quantum dot organic light emitting diode (OLED) display panel which can improve the brightness and the lifetime of a display panel.

2. Description of Related Art

With the fast development of the display technology, a high color gamut becomes an important development direction. The high color gamut means an even more colorful display picture with even stronger color performance. The quantum dot (QD) display technology belongs to an inventive semiconductor nanometer crystal technology and can accurately transmit light, highly improving a color gamut value and a view angle of a display screen to have even purer and colorful colors and even stronger color performance. Display devices with such technology not only generate dynamic colors having an even wider color gamut but also display a true color swatch in picture quality, thereby exceeding conventional backlit technologies.

With the fast development of the organic light emitting diode (OLED) display technology, touch products with a curved surface and flexible display are pushed to go to the market rapidly. Also, the related technologies are changing every day. The OLED is a light emitting diode caused by the infusion and recovery of carriers using an organic semiconductor material and a light emitting material which are driven by electric fields.

A quantum dot organic light emitting diode (QD-OLED) display panel combines OLED electroluminescence technology with QD photo-emission technology. The QD-OLED display panel includes an OLED array substrate for emitting a blue light, a quantum dot photo-transfer film, and a color filter (CF). The QD-OLED display panel uses a blue-ray OLED as a light source to trigger red/green quantum dots in the quantum dot photo-transfer film. After receiving the blue light, the red quantum dots are triggered to emit red light through the color filter. After receiving the blue light, the green quantum dots are triggered to emit green light through the color filter. The blue light directly passes through the color filter, and thus full-color display is formed. Because of superior performances of a wide color gamut and a wide view angle, the QD-OLED display panel is deemed as a potential technology of large-sized OLED.

Because the blue-ray OLED is required to trigger quantum dots to emit red/green light for red/green pixels and because the rest of the blue light is filtered by the color filter, the brightness of the red/green light is limited by the light transfer level of quantum dots. Currently, because of the limitation of lower efficiency of blue light, the whole brightness of the display panel is affected, and the lifetime of the display panel is reduced.

SUMMARY

For problems existed in conventional technologies, the object of the present disclosure is to provide a quantum dot organic light emitting diode (OLED) display panel which can effectively improve the brightness and the lifetime of a display panel.

In order to realize the above object, the present disclosure provides a quantum dot organic light emitting diode (OLED) display panel, including: a color filter including a color resist layer and an isolating layer covering the color resist layer, wherein the color resist layer includes a color resist unit, and the color resist unit includes a red sub-color-resist and a green sub-color-resist; a quantum dot photo-transfer film including a red quantum dot material and a green quantum dot material, wherein the red quantum dot material is formed on the isolating layer and corresponding to the red sub-color-resist, and the green quantum dot material is formed on the isolating layer and corresponding to the green sub-color-resist; and an OLED array substrate for emitting an OLED light source, wherein the OLED light source includes a blue light source and a color-mixture light source, wherein the color-mixture light source is disposed corresponding to the red sub-color-resist or the green sub-color-resist and consists of the blue light source and a light source whose a color corresponds to the red sub-color-resist or the green sub-color-resist; wherein the OLED array substrate is of a top-emissive structure, and the OLED array substrate, the quantum dot photo-transfer film, and the color filter are sequentially arranged along a light-out direction; and wherein a sub-color-resist and a corresponding light source define a sub-pixel on the quantum dot OLED display panel, and spectrums of the color filter, quantum dot photoluminescence, and the OLED light source which correspond to the same sub-pixel overlap with each other.

In order to realize the above object, the present disclosure provides a quantum dot organic light emitting diode (OLED) display panel, including: a color filter including a color resist layer, wherein the color resist layer includes a color resist unit, and the color resist unit includes a red sub-color-resist and a green sub-color-resist; a quantum dot photo-transfer film including a red quantum dot material and a green quantum dot material, wherein the red quantum dot material is formed corresponding to the red sub-color-resist, and the green quantum dot material is formed corresponding to the green sub-color-resist; and an OLED array substrate for emitting an OLED light source, wherein the OLED light source includes a blue light source and a color-mixture light source, wherein the color-mixture light source is disposed corresponding to the red sub-color-resist or the green sub-color-resist and consists of the blue light source and a light source whose a color corresponds to the red sub-color-resist or the green sub-color-resist.

The beneficial effect of the present disclosure is as follows: a red-and-blue mixture light source is used as the OLED light source corresponding to the red sub-color-resist of the color filter, and/or a green-and-blue mixture light source is used as the OLED light source corresponding to the green sub-color-resist of the color filter. The blue light source in the color-mixture light source can trigger a red/green quantum dot material of the quantum dot photo-transfer film, and the triggered light passes through the color filter. The red/green light source in the color-mixture light source can directly pass through the color filter, thereby effectively improving the brightness of the quantum dot OLED display panel and the efficiency of the display panel and prolonging the lifetime of the display panel.

BRIEF DESCRIPTION OF DRAWINGS

In order to more clearly illustrate technical solutions in the embodiments of the present disclosure, the drawings required for describing the embodiments will be briefly introduced below. It is obvious that the following drawings are merely some embodiments of the present disclosure, and a person having ordinary skill in this field can obtain other drawings according to these drawings under the premise of not paying creative works.

DETAILED DESCRIPTION OF EMBODIMENTS

Figure 1:
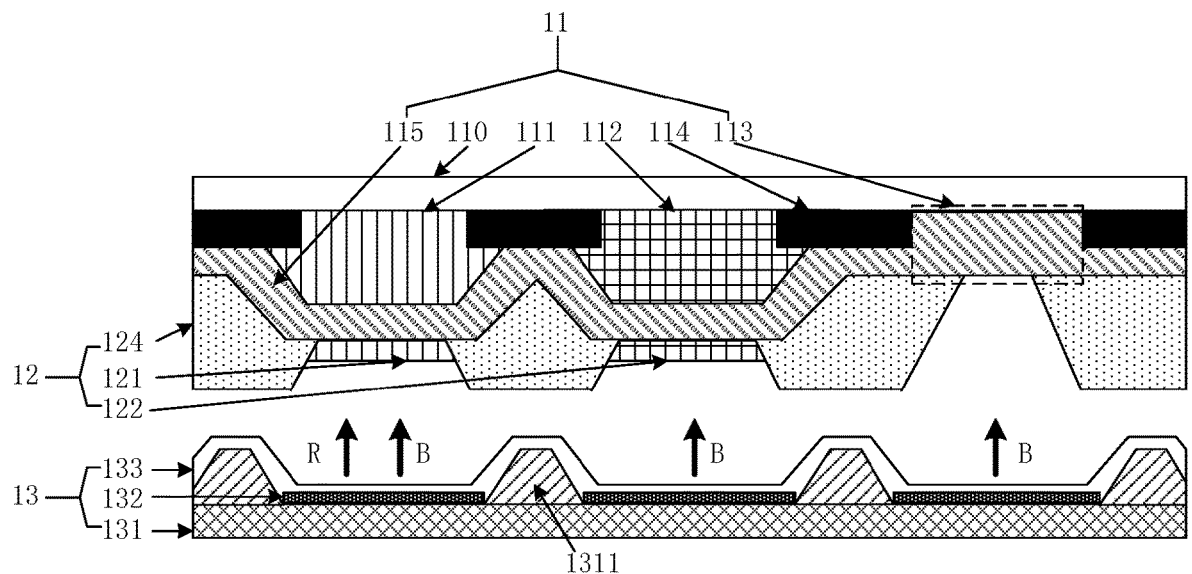
FIG. 1 is a schematic structural diagram of film layers of a quantum dot organic light emitting diode (OLED) display panel according to a first embodiment of the present disclosure.

The embodiments of the present disclosure are described in detail below, and their examples are shown in the accompanying drawings. The same or similar elements or elements having the same or similar functions are denoted by the same or similar reference numerals throughout the descriptions. The following embodiments referring to the accompanying drawings are illustrative and merely used for explaining the present disclosure without being regarded as a limitation to the present disclosure.

Terms "first", "second", "third" and the like (if existing) in the specification, the claims, and the accompanying drawings are used to distinguish similar objects instead of describing a specific sequence or a precedence order. It should be understood that the described objects can be exchanged in any suitable situations. In addition, terms "include", "have" and any variations thereof intend to cover nonexclusive inclusions.

In the present disclosure, unless specified or limited otherwise, it should be noted that, a structure in which a first feature is "on" or "beneath" a second feature may include an embodiment in which the first feature directly contacts the second feature, and may also include an embodiment in which an additional feature is formed between the first feature and the second feature so that the first feature does not directly contact the second feature. Furthermore, a first feature "on", "above", or "on top of" a second feature may include an embodiment in which the first feature is right "on", "above", or "on top of" the second feature, and may also include an embodiment in which the first feature is not right "on", "above", or "on top of" the second feature, or just means that the first feature has a sea level elevation greater than the sea level elevation of the second feature. While first feature "beneath", "below", or "on bottom of" a second feature may include an embodiment in which the first feature is right "beneath", "below", or "on bottom of" the second feature, and may also include an embodiment in which the first feature is not right "beneath", "below", or "on bottom of" the second feature, or just means that the first feature has a sea level elevation less than the sea level elevation of the second feature.

The following description provides various embodiments or examples for implementing various structures of the present disclosure. To simplify the description of the present disclosure, parts and settings of specific examples are described as follows. Certainly, they are only illustrative, and are not intended to limit the present disclosure. Further, reference numerals and reference letters may be repeated in different examples. This repetition is for purposes of simplicity and clarity and does not indicate a relationship of the various embodiments and/or the settings. Furthermore, the present disclosure provides specific examples of various processes and materials, however, a person skilled in the art may be aware of applications of other processes and/or other materials.

A quantum dot organic light emitting diode (OLED) display panel of the present disclosure includes a color filter including a color resist layer, wherein the color resist layer includes a color resist unit, and the color resist unit includes a red sub-color-resist and a green sub-color-resist; a quantum dot photo-transfer film including a red quantum dot material and a green quantum dot material, wherein the red quantum dot material is formed corresponding to the red sub-color-resist, and the green quantum dot material is formed corresponding to the green sub-color-resist; and an OLED array substrate for emitting an OLED light source, wherein the OLED light source includes a blue light source and a color-mixture light source, wherein the color-mixture light source is disposed corresponding to the red sub-color-resist or the green sub-color-resist and consists of the blue light source and a light source whose a color corresponds to the red sub-color-resist or the green sub-color-resist.

In the quantum dot organic light emitting diode (OLED) display panel of the present disclosure, one or both of the OLED light sources corresponding to the red sub-color-resist and the green sub-color-resist of the color filter can be used with the color-mixture light source. When a red-and-blue mixture light source (i.e., a purple light source) corresponding to the red sub-color-resist of the color filter passes through the red quantum dot material of the quantum dot photo-transfer film and the red sub-color-resist of the color filter, the blue light source in the red-and-blue mixture light source can trigger the red quantum dot material to emit red light, and the triggered red light passes through the red sub-color-resist on the one hand; on the other hand, a red light source in the red-and-blue mixture light source can directly pass through the red sub-color-resist. When a green-and-blue mixture light source (i.e., a cyan light source) corresponding to the green sub-color-resist of the color filter passes through the green quantum dot material of the quantum dot photo-transfer film and the green sub-color-resist of the color filter, the blue light source in the green-and-blue mixture light source can trigger the green quantum dot material to emit green light, and the triggered green light passes through the green sub-color-resist on the one hand; on the other hand, a green light source in the green-and-blue mixture light source can directly pass through the red sub-color-resist. Thus, the brightness of the quantum dot OLED display panel and the efficiency of the display panel can be effectively improved, and the lifetime of the display panel is prolonged.

In the quantum dot organic light emitting diode (OLED) display panel of the present disclosure, the color resist unit further includes a blue sub-color-resist or a blank region. In the quantum dot photo-transfer film, a blue quantum dot material, light-scattering particles, or a blank are formed corresponding to the blue sub-color-resist (or the blank region). The blue light source corresponding to the blue sub-color-resist (or the blank region) of the color filter can directly pass through the blue sub-color-resist (or the blank region) and can also trigger the blue quantum dot material to emit blue light through the blue sub-color-resist (or the blank region) and can further pass through the blue sub-color-resist (or the blank region) through the improved light diffusion ability caused by the light-scattering particles, further improving the brightness of the quantum dot OLED display panel.

Preferably, a sub-color-resist and a corresponding light source define a sub-pixel on the quantum dot OLED display panel. A spectrum of the color filter, a spectrum of quantum dot photoluminescence (QDPL), and a spectrum of the OLED light source which correspond to the same sub-pixel basically overlap with each other, thereby improving light transparency and the brightness of the display panel. For instance, a red sub-color-resist and a corresponding red-and-blue mixture light source (or the blue light source) define a red sub-pixel on the quantum dot OLED display panel. A spectrum of the color filter (i.e., a spectrum of the red sub-color-resist), a QDPL spectrum (i.e., a spectrum of the red quantum dot material), and a spectrum of the OLED light source (i.e., a spectrum of the blue light triggering the red quantum dot material, or a spectrum of the red-and-blue mixture light source) which correspond to the red sub-pixel are guaranteed to overlap with each other to the greatest extent. A green sub-color-resist and a corresponding green-and-blue mixture light source (or the blue light source) define a green sub-pixel. A spectrum of the color filter (i.e., a spectrum of the green sub-color-resist), a QDPL spectrum (i.e., a spectrum of the green quantum dot material), and a spectrum of the OLED light source (i.e., a spectrum of the blue light triggering the green quantum dot material, or a spectrum of the green-and-blue mixture light source) which correspond to the green sub-pixel are guaranteed to overlap with each other to the greatest extent.

Preferably, the quantum dot photo-transfer film is formed on the color resist layer through an inkjet printing method, which can effectively improve product yield of the OLED display panel and can reduce production costs simultaneously.

Preferably, the OLED array substrate is of a top-emissive structure, and the OLED array substrate, the quantum dot photo-transfer film, and the color filter are sequentially arranged along a light-out direction. The OLED array substrate is controlled by a thin-film transistor (TFT) array. The TFT array and metal traces are disposed on a substrate. It is because the top-emissive structure is used to emit light that the light is emitted above the OLED array substrate, causing the TFT array and the metal traces on the substrate not to affect a light-out area of a light source. Compared with a bottom-emissive panel, a top-emissive panel with the same brightness has a lower working voltage of OLED and can have a longer lifetime.

Please refer to FIG. 1, which is a schematic structural diagram of film layers of a quantum dot organic light emitting diode (OLED) display panel according to a first embodiment of the present disclosure. In the embodiment, the quantum dot OLED display panel includes a color filter 11, a quantum dot photo-transfer film 12, and an OLED array substrate 13 sequentially arranged along a light-out direction.

The color filter 11 includes a glass substrate 110 and a color resist layer sequentially arranged along the light-out direction. The color resist layer is disposed on one side of the glass substrate 110, away from the light-out direction. The color resist layer includes a color resist unit, and the color resist unit includes a red sub-color-resist 111, a green sub-color-resist 112, and a blank region 113 (shown as a dotted box in the figure). Preferably, the red sub-color-resist 111, the green sub-color-resist 112, and the blank region 113 are separated by a black matrix (BM) 114. Preferably, the color filter 11 further includes an isolating layer 115 covering the red sub-color-resist 111, the green sub-color-resist 112, the blank region 113, and the black matrix 114. The isolating layer 115 is used to isolate the color filter 11 and the quantum dot photo-transfer film 12, and to make the spread of printing materials even better when quantum dot materials of the quantum dot photo-transfer film 12 are printed. In other embodiments, a blue sub-color-resist can be disposed in the blank region 113.

In the quantum dot photo-transfer film 12, a red quantum dot material QD-R 121 is formed corresponding to the red sub-color-resist 111, a green quantum dot material QD-G 122 is formed corresponding to the green sub-color-resist 112, and a blank is formed corresponding to the blank region 113. The red quantum dot material 121 is formed on the isolating layer 115 and corresponding to the red sub-color-resist 111 through an inkjet printing method, and the green quantum dot material 122 is formed on the isolating layer 115 and corresponding to the green sub-color-resist 112 through the inkjet printing method. Using the inkjet printing method can effectively improve product yield of the OLED display panel and can reduce production costs simultaneously. The spectrum of the above quantum dot materials can be adjusted using sizes of quantum dots. The red/green quantum dot materials may be the same. The above quantum dot materials includes, but not limited to, CdS, CdSe, ZnCdS, ZnCdSe, InP, or one or more perovskite materials.

In other embodiments, in the quantum dot photo-transfer film 12, a blue quantum dot material QD-B or light-scattering particles can also be formed corresponding to the blank region 113. In order to improve light diffusion ability, the light-scattering particles can be mixed in the film layers of the quantum dot photo-transfer film 12, and can also be located in a resinous system outside the quantum dot photo-transfer film 12. The materials of the light-scattering particles are organic or inorganic materials. The light-scattering particles have nanometer-scale or micrometer-scale sizes. The light-scattering particles can have isotropy or anisotropy.

Preferably, the quantum dot photo-transfer film 12 includes an organic protective layer 124 configured to limit film-forming regions of the red quantum dot material 121 and the green quantum dot material 122. Specifically, the organic protective layer 124 can be made of transparent or non-transparent resin materials. When the organic protective layer 124 is made of non-transparent resin materials, the red quantum dot material 121 is limited to correspond to the red sub-color-resist 111, the green quantum dot material 122 is limited to correspond to the green sub-color-resist 112, a blank is formed corresponding to the blank region 113, and other regions are non-transparent to block light.

An OLED light source emitted from the OLED array substrate 13 includes a blue light source (shown as the alphabet B in the figure) and a red-and-blue mixture light source (shown as the alphabets R and B in the figure) consisting of the blue light source and a red light source. The red-and-blue mixture light source is disposed corresponding to the red sub-color-resist 111 of the color filter 11. The blue light source in the red-and-blue mixture light source is used to trigger the red quantum dot material 121 of the quantum dot photo-transfer film 12 to emit red light, and the red light passes through the red sub-color-resist 111. The red light source in the red-and-blue mixture light source can directly pass through the red sub-color-resist 111. Thus, the brightness of the display panel is improved.

The OLED array substrate 13 is of a top-emissive structure and includes a top-emissive OLED device 132, a thin film encapsulation (TFE) 133, and a TFT array substrate 131 having a pixel definition layer 1311 which are sequentially arranged along a light-out direction. The TFTs of the TFT array substrate 131 can be indium gallium zinc oxide (IGZO) TFTs or low temperature poly-silicon (LTPS) TFTs. The pixel definition layer 1311 is used to define and limit a location of the top-emissive OLED device 132, and further to define and limit a size and a location of each sub-pixel. The top-emissive OLED device 132 includes a reflective anode, an OLED functional layer, an OLED light-emitting layer, a transparent cathode, and a light-capturing layer. The OLED functional layer includes one or more of a hole injection layer, a hole transport layer, an electronic transport layer, and an electronic injection layer. The top-emissive OLED device 132 can include one or more layers of the OLED functional layer and the OLED light-emitting layer. The reflective anode can be made of ITO/Ag/ITO materials. The transparent cathode can be made of IZO and Mg/Ag materials. The thin film encapsulation 133 is formed by overlapped inorganic and organic materials. At least one layer of inorganic encapsulation material is made.

Figure 2:
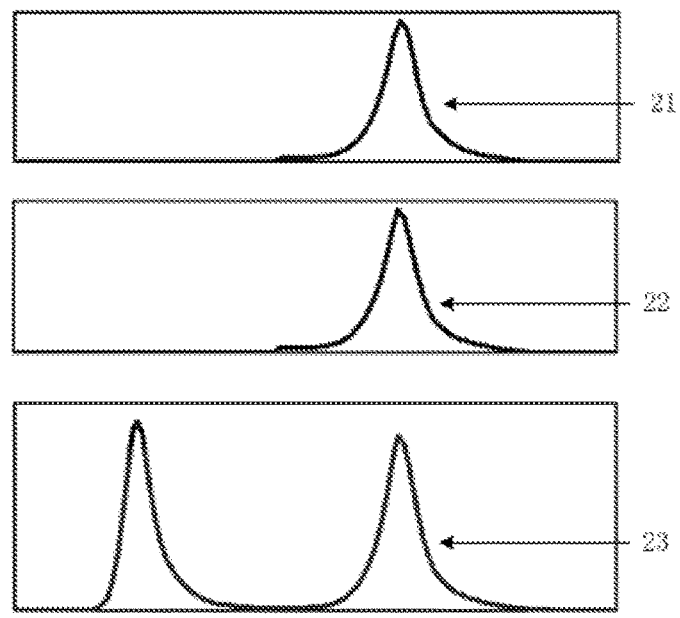
FIG. 2 is a schematic diagram of a spectrum of the color filter, a QDPL spectrum, and a spectrum of the color mixture light source which correspond to a red sub-pixel in a quantum dot OLED display panel according to the present disclosure.

Please refer to FIG. 2, which is a schematic diagram of a spectrum of the color filter, a QDPL spectrum, and a spectrum of the color mixture light source which correspond to the red sub-pixel in a quantum dot OLED display panel according to the present disclosure. As shown in FIG. 2, a spectrum of the color filter (i.e., a spectrum of the red sub-color-resist), a QDPL spectrum (i.e., a spectrum of the red quantum dot material), and a spectrum of the OLED light source (i.e., a spectrum of the red-and-blue mixture light source) which correspond to the red sub-pixel basically overlap with each other. Thus, the brightness of the display panel and light transparency are improved.

Figure 3:
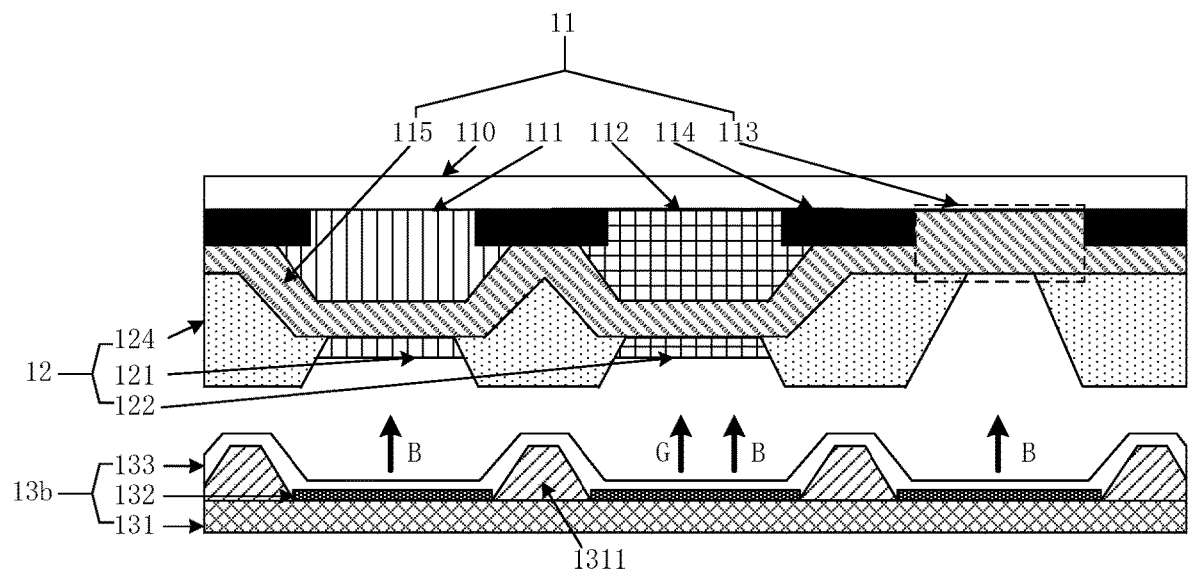
FIG. 3 is a schematic structural diagram of film layers of a quantum dot organic light emitting diode (OLED) display panel according to a second embodiment of the present disclosure.

Please refer to FIG. 3, which is a schematic structural diagram of film layers of a quantum dot organic light emitting diode (OLED) display panel according to a second embodiment of the present disclosure. A difference that exists between the present embodiment and the embodiment as shown in FIG. 1 is that an OLED light source emitted from the OLED array substrate 13b includes a blue light source (shown as the alphabet B in the figure) and a green-and-blue mixture light source (shown as the alphabets G and B in the figure) consisting of the blue light source and a green light source. The green-and-blue mixture light source is disposed corresponding to the green sub-color-resist 112 of the color filter 11. The blue light source in the green-and-blue mixture light source is used to trigger the green quantum dot material 122 of the quantum dot photo-transfer film 12 to emit green light, and the green light passes through the green sub-color-resist 112. The green light source in the green-and-blue mixture light source can directly pass through the green sub-color-resist 112. Thus, the brightness of the display panel is improved. Specifically, the green-and-blue mixture light source is of an overlapped top-emissive structure with a green light and a blue light.

Preferably, a spectrum of the color filter (i.e., a spectrum of the green sub-color-resist), a QDPL spectrum (i.e., a spectrum of the green quantum dot material), and a spectrum of the OLED light source (i.e., a spectrum of the green-and-blue mixture light source) which correspond to the green sub-pixel are guaranteed to overlap with each other to the greatest extent. Thus, the brightness of the display panel and light transparency are improved.

Figure 4:
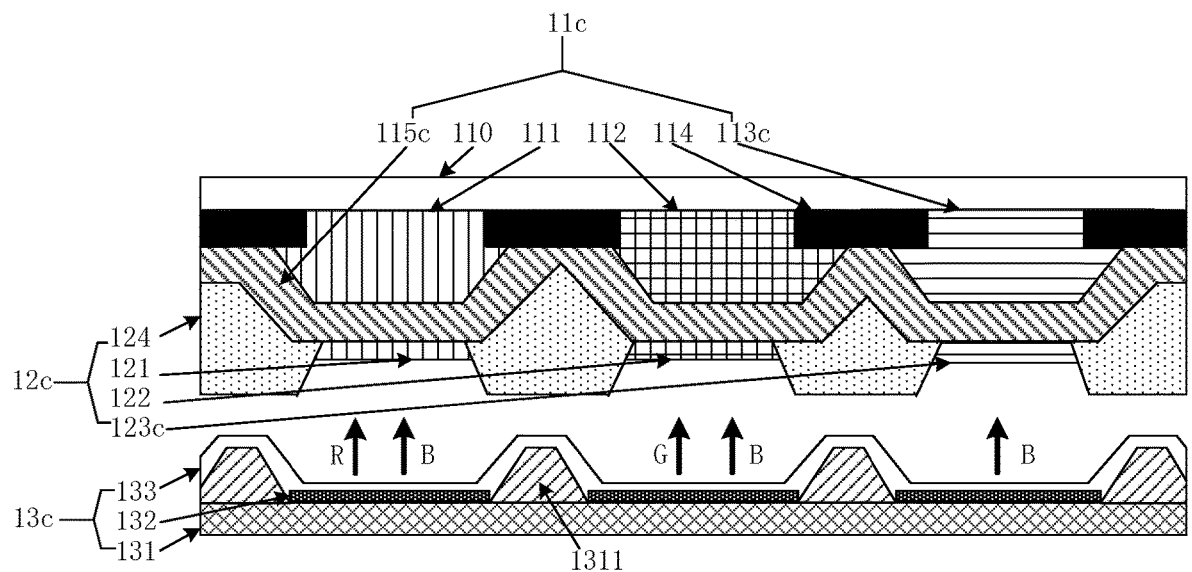
FIG. 4 is a schematic structural diagram of film layers of a quantum dot organic light emitting diode (OLED) display panel according to a third embodiment of the present disclosure.

Please refer to FIG. 4, which is a schematic structural diagram of film layers of a quantum dot organic light emitting diode (OLED) display panel according to a third embodiment of the present disclosure. A difference that exists between the present embodiment and the embodiment as shown in FIG. 1 is that an OLED light source emitted from the OLED array substrate 13c includes a blue light source (shown as the alphabet B in the figure), a red-and-blue mixture light source (shown as the alphabets R and B in the figure) consisting of the blue light source and a red light source, and a green-and-blue mixture light source (shown as the alphabets G and B in the figure) consisting of the blue light source and a green light source. The red-and-blue mixture light source is disposed corresponding to the red sub-color-resist 111 of the color filter 11. The green-and-blue mixture light source is disposed corresponding to the green sub-color-resist 112 of the color filter 11. The blue light source in the red-and-blue mixture light source is used to trigger the red quantum dot material 121 of the quantum dot photo-transfer film 12 to emit red light, and the red light passes through the red sub-color-resist 111. The red light source in the red-and-blue mixture light source can directly pass through the red sub-color-resist 111. The blue light source in the green-and-blue mixture light source is used to trigger the green quantum dot material 122 of the quantum dot photo-transfer film 12 to emit green light, and the green light passes through the green sub-color-resist 112. The green light source in the green-and-blue mixture light source can directly pass through the green sub-color-resist 112. Thus, the brightness of the display panel is improved. Specifically, the red-and-blue mixture light source is of an overlapped top-emissive structure with a red light and a blue light, and the green-and-blue mixture light source is of an overlapped top-emissive structure with a green light and a blue light.

Further, the difference that exists between the present embodiment and the embodiment as shown in FIG. 1 is that a color resist unit of the color filter 11c includes a red sub-color-resist 111, a green sub-color-resist 112, and a blue sub-color-resist 113c. The red sub-color-resist 111, the green sub-color-resist 112, and the blue sub-color-resist 113c are separated by a black matrix 114. An isolating layer 115c covers the red sub-color-resist 111, the green sub-color-resist 112, the blue sub-color-resist 113c, and the black matrix 114. Correspondingly, in the quantum dot photo-transfer film 12c, a blue quantum dot material QD-B 123c is formed corresponding to the blue sub-color-resist 113c. In other embodiments, in the quantum dot photo-transfer film 12c, light-scattering particles or a blank can also be formed corresponding to the blue sub-color-resist 113c.

Preferably, a spectrum of the color filter (i.e., a spectrum of the red sub-color-resist), a QDPL spectrum (i.e., a spectrum of the red quantum dot material), and a spectrum of the OLED light source (i.e., a spectrum of the red-and-blue mixture light source) which correspond to the red sub-pixel are guaranteed to overlap with each other to the greatest extent. A spectrum of the color filter (i.e., a spectrum of the green sub-color-resist), a QDPL spectrum (i.e., a spectrum of the green quantum dot material), and a spectrum of the OLED light source (i.e., a spectrum of the green-and-blue mixture light source) which correspond to the green sub-pixel are guaranteed to overlap with each other to the greatest extent. A spectrum of the color filter (i.e., a spectrum of the blue sub-color-resist), a QDPL spectrum (i.e., a spectrum of the blue quantum dot material), and a spectrum of the OLED light source (i.e., a spectrum of a blue light) which correspond to the blue sub-pixel are guaranteed to overlap with each other to the greatest extent. Thus, the brightness of the display panel and light transparency are improved.

The industrial applicability of the present disclosure is that, topics of the present disclosure can be manufactured and used, and thus the industrial applicability is realized.

What is claimed is:

1. A quantum dot organic light emitting diode (OLED) display panel, comprising:
    a color filter comprising a color resist layer and an isolating layer covering the color resist layer, wherein the color resist layer comprises a color resist unit, and the color resist unit comprises a red sub-color-resist and a green sub-color-resist;
    a quantum dot photo-transfer film comprising a red quantum dot material and a green quantum dot material, wherein the red quantum dot material is formed on the isolating layer and corresponding to the red sub-color-resist, and the green quantum dot material is formed on the isolating layer and corresponding to the green sub-color-resist; and
    an OLED array substrate for emitting an OLED light source, wherein the OLED light source comprises a blue light source and a color-mixture light source, wherein the color-mixture light source is disposed corresponding to the red sub-color-resist or the green sub-color-resist and consists of the blue light source and a light source whose a color corresponds to the red sub-color-resist or the green sub-color-resist;
    wherein the OLED array substrate is of a top-emissive structure, and the OLED array substrate, the quantum dot photo-transfer film, and the color filter are sequentially arranged along a light-out direction; and
    wherein a sub-color-resist and a corresponding light source define a sub-pixel on the quantum dot OLED display panel, and spectrums of the color filter, quantum dot photoluminescence, and the OLED light source which correspond to the same sub-pixel overlap with each other.

2. The quantum dot OLED display panel of claim 1, wherein the color-mixture light source consists of the blue light source and a red light source and is disposed corresponding to the red sub-color-resist; or
    the color-mixture light source consists of the blue light source and a green light source and is disposed corresponding to the green sub-color-resist.

3. The quantum dot OLED display panel of claim 1, wherein the color-mixture light source comprises:
    a red-and-blue mixture light source consisting of the blue light source and a red light source, wherein the red-and-blue mixture light source is disposed corresponding to the red sub-color-resist; and
    a green-and-blue mixture light source consisting of the blue light source and a green light source, wherein the green-and-blue mixture light source is disposed corresponding to the green sub-color-resist.

4. The quantum dot OLED display panel of claim 1, wherein the quantum dot photo-transfer film comprises an organic protective layer configured to limit film-forming regions of the red quantum dot material and the green quantum dot material.

5. The quantum dot OLED display panel of claim 1, wherein the quantum dot photo-transfer film is formed on the color resist layer through an inkjet printing method.

6. The quantum dot OLED display panel of claim 1, wherein the red quantum dot material is formed on the isolating layer and corresponding to the red sub-color-resist through an inkjet printing method, and the green quantum dot material is formed on the isolating layer and corresponding to the green sub-color-resist through the inkjet printing method.

7. The quantum dot OLED display panel of claim 1, wherein the color resist unit further comprises a blue sub-color-resist, wherein in the quantum dot photo-transfer film, a blue quantum dot material, light-scattering particles, or a blank are formed corresponding to the blue sub-color-resist, and wherein the blue light source is disposed corresponding to the blue sub-color-resist.

8. The quantum dot OLED display panel of claim 1, wherein the color resist unit further comprises a blank region, wherein in the quantum dot photo-transfer film, a blue quantum dot material, light-scattering particles, or a blank are formed corresponding to the blank region, and wherein the blue light source is disposed corresponding to the blank region.

9. A quantum dot organic light emitting diode (OLED) display panel, comprising:
    a color filter comprising a color resist layer, wherein the color resist layer comprises a color resist unit, and the color resist unit comprises a red sub-color-resist and a green sub-color-resist;
    a quantum dot photo-transfer film comprising a red quantum dot material and a green quantum dot material, wherein the red quantum dot material is formed corresponding to the red sub-color-resist, and the green quantum dot material is formed corresponding to the green sub-color-resist; and
    an OLED array substrate for emitting an OLED light source, wherein the OLED light source comprises a blue light source and a color-mixture light source, wherein the color-mixture light source is disposed corresponding to the red sub-color-resist or the green sub-color-resist and consists of the blue light source and a light source whose a color corresponds to the red sub-color-resist or the green sub-color-resist.

10. The quantum dot OLED display panel of claim 9, wherein a sub-color-resist and a corresponding light source define a sub-pixel on the quantum dot OLED display panel, and spectrums of the color filter, quantum dot photoluminescence, and the OLED light source which correspond to the same sub-pixel overlap with each other.

11. The quantum dot OLED display panel of claim 9, wherein the color-mixture light source consists of the blue light source and a red light source and is disposed corresponding to the red sub-color-resist; or
    the color-mixture light source consists of the blue light source and a green light source and is disposed corresponding to the green sub-color-resist.

12. The quantum dot OLED display panel of claim 9, wherein the color-mixture light source comprises:
    a red-and-blue mixture light source consisting of the blue light source and a red light source, wherein the red-and-blue mixture light source is disposed corresponding to the red sub-color-resist; and
    a green-and-blue mixture light source consisting of the blue light source and a green light source, wherein the green-and-blue mixture light source is disposed corresponding to the green sub-color-resist.

13. The quantum dot OLED display panel of claim 9, wherein the OLED array substrate is of a top-emissive structure, and the OLED array substrate, the quantum dot photo-transfer film, and the color filter are sequentially arranged along a light-out direction.

14. The quantum dot OLED display panel of claim 9, wherein the quantum dot photo-transfer film comprises an organic protective layer configured to limit film-forming regions of the red quantum dot material and the green quantum dot material.

15. The quantum dot OLED display panel of claim 9, wherein the quantum dot photo-transfer film is formed on the color resist layer through an inkjet printing method.

16. The quantum dot OLED display panel of claim 9, wherein the color filter comprises an isolating layer covering the color resist layer; and
    wherein the red quantum dot material is formed on the isolating layer and corresponding to the red sub-color-resist, and the green quantum dot material is formed on the isolating layer and corresponding to the green sub-color-resist.

17. The quantum dot OLED display panel of claim 16, wherein the red quantum dot material is formed on the isolating layer and corresponding to the red sub-color-resist through an inkjet printing method, and the green quantum dot material is formed on the isolating layer and corresponding to the green sub-color-resist through the inkjet printing method.

18. The quantum dot OLED display panel of claim 9, wherein the color resist unit further comprises a blue sub-color-resist, wherein in the quantum dot photo-transfer film, a blue quantum dot material, light-scattering particles, or a blank are formed corresponding to the blue sub-color-resist, and wherein the blue light source is disposed corresponding to the blue sub-color-resist.

19. The quantum dot OLED display panel of claim 9, wherein the color resist unit further comprises a blank region, wherein in the quantum dot photo-transfer film, a blue quantum dot material, light-scattering particles, or a blank are formed corresponding to the blank region, and wherein the blue light source is disposed corresponding to the blank region.

* * * * *

UNITED STATES PATENT AND TRADEMARK OFFICE
CERTIFICATE OF CORRECTION

Page 1 of 1

PATENT NO. : 10,923,672 B1
APPLICATION NO. : 16/623412
DATED : February 16, 2021
INVENTOR(S) : Yuanyuan Li It is certified that error appears in the above-identified patent and that said Letters Patent is hereby corrected as shown below:

On the Title Page

Below Item (63) insert as Item (30) Foreign Application Priority Data the following:
Chinese Patent Application No. 201910816773.X Signed and Sealed this
Twenty-fourth Day of August, 2021

Drew Hirshfeld
*Performing the Functions and Duties of the*
*Under Secretary of Commerce for Intellectual Property and*
*Director of the United States Patent and Trademark Office*